United States Patent
Seok et al.

(10) Patent No.: US 12,196,796 B2
(45) Date of Patent: Jan. 14, 2025

(54) SYSTEM FOR TESTING ANTENNA PERFORMANCE

(71) Applicant: AMOSENSE CO., LTD, Cheonan-si (KR)

(72) Inventors: Wonjin Seok, Cheonan-si (KR);
Hyungil Baek, Cheonan-si (KR);
Kyunghyun Ryu, Cheonan-si (KR);
Chanwoo Lee, Cheonan-si (KR);
Jungryul Kim, Cheonan-si (KR)

(73) Assignee: AMOSENSE CO., LTD, Cheonan-si (KR)

( * ) Notice: Subject to any disclaimer, the term of this patent is extended or adjusted under 35 U.S.C. 154(b) by 0 days.

(21) Appl. No.: 18/013,834

(22) PCT Filed: Jun. 30, 2021

(86) PCT No.: PCT/KR2021/008220
§ 371 (c)(1),
(2) Date: Dec. 29, 2022

(87) PCT Pub. No.: WO2022/005186
PCT Pub. Date: Jan. 6, 2022

(65) Prior Publication Data
US 2024/0241164 A1    Jul. 18, 2024

(30) Foreign Application Priority Data
Jun. 30, 2020    (KR) .................. 10-2020-0080527

(51) Int. Cl.
*G01R 29/10*    (2006.01)
*G01R 29/08*    (2006.01)
*G01R 35/00*    (2006.01)

(52) U.S. Cl.
CPC ......... *G01R 29/10* (2013.01); *G01R 29/0878* (2013.01); *G01R 29/0892* (2013.01); *G01R 35/007* (2013.01)

(58) Field of Classification Search
USPC .................................. 324/612, 626, 750.26
See application file for complete search history.

(56) References Cited

U.S. PATENT DOCUMENTS

| 8,525,744 B2 | 9/2013 | Teshirogi et al. | |
|---|---|---|---|
| 2016/0254870 A1* | 9/2016 | O'Keeffe | H04B 17/14 455/67.14 |

(Continued)

FOREIGN PATENT DOCUMENTS

| CN | 108152772 A | 6/2018 |
|---|---|---|
| JP | 2003-075489 A | 3/2003 |

(Continued)

*Primary Examiner* — Vincent Q Nguyen
(74) *Attorney, Agent, or Firm* — Maschoff Brennan (57) ABSTRACT

In a system for testing antenna performance, antenna performance is tested by reflecting the loss of a cable used in the antenna performance test. The system for testing antenna performance includes a tester having a test port, the test port being connected, via a cable, to an antenna that communicates with a terminal to be tested, in a shield box, when a test mode is set, wherein the tester outputs a test signal to the test port, receives a response signal corresponding to the test signal via the test port, and obtains a value, as a communication performance measurement value, by adding a calibration value to a reception signal strength of the response signal.

9 Claims, 10 Drawing Sheets

(56) References Cited

U.S. PATENT DOCUMENTS

2020/0191848 A1* 6/2020 Grossmann ............ H04B 17/12
2020/0259259 A1* 8/2020 Pfeiffer ................ H01Q 13/206
2021/0399814 A1* 12/2021 Qi ........................ H04B 7/0417

FOREIGN PATENT DOCUMENTS

| JP | 2006-258756 A | 9/2006 |
| JP | 2012-163444 A | 8/2012 |
| JP | 5085728 B2 | 11/2012 |

* cited by examiner

SYSTEM FOR TESTING ANTENNA PERFORMANCE

BACKGROUND OF THE INVENTION

Field of the Invention

The present disclosure relates to a system for testing antenna performance, and more particularly, to a system for testing antenna performance in which performance of an antenna mounted in a mobile terminal is tested.

Description of Related Art

Recently, research into technology for applying ultra wide band (UWB) antennas to mobile terminals has been conducted. The UWB antenna is used as an antenna for measuring a distance to an object, a position of an object, a position of a mobile terminal, and the like.

Communication using the UWB antenna (hereinafter, referred to as UWB communication) may provide high-precision wireless positioning and communication functions through an impulse signal. The UWB communication has a transmission distance of approximately 10 m to 1 km while using a frequency band of approximately 3.1 GHz to 10.6 GHz. The UWB communication is advantageous for distance measurement due to excellent time resolution of several nsec pulses, and enables low-power realization of a low duty cycle.

Since the UWB antenna is used for precise position measurement, an antenna performance test is conducted in a development/manufacturing stage of a mobile terminal mounted with the UWB antenna.

The antenna performance test is conducted in a state in which a mobile terminal to be measured and the UWB antenna are disposed in a shield box. The UWB antenna outputs a UWB frequency band signal (hereinafter, referred to as a UWB output signal) and receives a UWB frequency band signal (hereinafter, referred to as a UWB reception signal) from the mobile terminal to be measured.

A system for testing antenna performance is connected to the UWB antenna via a radio frequency (RF) cable, and performs an antenna performance test and calibration of the mobile terminal using the UWB output signal and the UWB received signal.

However, a system for testing antenna performance according to the related art does not reflect loss due to the RF cable, such that it is difficult to accurately perform the antenna performance test and calibration.

BRIEF SUMMARY OF THE INVENTION

An aspect of the present disclosure provides a system for testing antenna performance in which antenna performance is tested by reflecting loss of a cable used in an antenna performance test.

According to a characteristic of the present disclosure for achieving the object, the present disclosure includes a system for testing antenna performance including a tester including a test port, the test port being connected, via a cable, to an antenna that communicates with a terminal to be tested, in a shield box, when a test mode is set, wherein the tester outputs a test signal to the test port, receives a response signal corresponding to the test signal via the test port, and calculates a value obtained by adding a calibration value to a received signal strength of the response signal as a communication performance measurement value.

The system for testing antenna performance may further include a signal generator including an output port and outputting a reference signal having a reference signal strength to the output port, wherein the tester may further include a calibration port connected to the output port via the cable when a calibration mode is set, and set the calibration value based on the reference signal strength and a received signal strength of the reference signal input to the calibration port when the calibration mode is set. In this case, the tester may calculate a difference value between the reference signal strength and the received signal strength as a loss value of the cable and set the loss value as the calibration value.

The tester may further include a test port connected to a calibration port via the cable in a self-diagnosis mode, and the tester may generate a value obtained by subtracting, from a signal strength of a self-diagnosis signal output via the test port, a received signal strength of the self-diagnosis signal received via the calibration port, as a self-diagnosis result.

The tester may include: a signal processing element measuring a received signal strength of a reference signal input via a receiving terminal when a calibration mode is set; and a microcontroller connected to the signal processing element, calculating a difference between the received signal strength measured by the signal processing element and a reference signal strength as a loss value of the cable, and setting the loss value as the calibration value. In this case, the signal processing element may output a test signal to an output terminal when the test mode is set, receive a response signal corresponding to the test signal via a receiving terminal different from the receiving terminal, and measure a received signal strength of the response signal, and the microcontroller may set a value obtained by adding the calibration value to the received signal strength measured by the signal processing element as a communication performance measurement value.

The tester further may include: a test port connected, via the cable, to the antenna that communicates with the terminal to be tested, in the shield box, when the test mode is set, outputting the test signal from the output terminal of the signal processing element to the antenna, and receives the response signal corresponding to the test signal from the antenna; and a switch switching to the different receiving terminal to connect the test port and the different receiving terminal to each other and outputting the response signal input to the test port to the different receiving terminal.

The tester may include: a signal processing element including an output terminal and a receiving terminal, outputting a self-diagnosis signal having a reference signal strength to the output terminal when a self-diagnosis mode is set, and measuring a received signal strength of a received signal received through the receiving terminal; and a microcontroller generating a tester abnormality alarm based on the received signal strength. In this case, the microcontroller may determine that the tester is abnormal and generate the tester abnormality alarm, when the received signal strength is out of an error range of a self-diagnosis reference value, and the receiving terminal may include a first receiving terminal and a second receiving terminal, and the tester may further include a switch switching the output terminal to one of the first receiving terminal and the second receiving terminal.

The present disclosure has effects in that a system for testing antenna performance may easily measure loss of a cable used in an antenna performance test by calculating the loss of the cable through a difference between an output signal strength of a signal generator and a received signal strength of a tester.

In addition, the present disclosure has effects in that the system for testing antenna performance may measure antenna performance in which the loss of the cable is reflected by setting the calculated loss of the cable as a calibration value and reflecting the calibration value on a measurement value measured in the antenna performance test.

Further, the present disclosure has effects in that the system for testing antenna performance may improve accuracy of a antenna performance test result by measuring the antenna performance in which the loss of the cable is reflected.

Further, the present disclosure has effects in that the system for testing antenna performance may easily grasp performance deterioration of the system for testing antenna performance and maintain optimal state to provide an accurate antenna performance test result by adding a self-diagnosis path to perform a self-diagnosis and generating an alarm when an abnormality occurs.

Further, the present disclosure has effects in that the system for testing antenna performance may build an antenna performance test environment at a lower cost than an existing device for testing antenna performance, and may build an antenna performance test environment even in an experimental environment in which connection of a power supply is difficult.

DETAILED DESCRIPTION OF THE INVENTION

Hereinafter, the most preferred embodiments of the present disclosure will be described with reference to the accompanying drawings in order to describe the present disclosure in detail so that those skilled in the art to which the present disclosure pertains may easily practice the technical idea of the present disclosure. First, it is to be noted that in adding reference numerals to components of the respective drawings, the same components will be denoted by the same reference numerals as much as possible even though they are illustrated in different drawings. Further, in describing the present disclosure, when it is determined that a detailed description of a related known configuration or function may obscure the gist of the present disclosure, the detailed description will be omitted.

A system for testing antenna performance according to an embodiment of the present disclosure is a device for measuring ultra wide band (UWB) communication performance of a terminal to be tested. The system for testing antenna performance measures loss of a radio frequency (RF) cable used in a performance test of the terminal to be tested, and outputs a performance measurement value reflecting the measured loss of the RF cable. Accordingly, the system for testing antenna performance may accurately measure UWB communication performance of the terminal to be tested.

Figure 1:
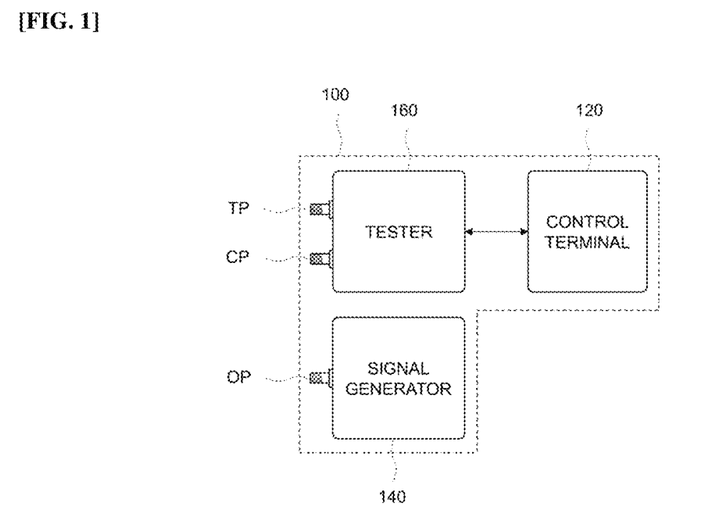
FIG. 1 is a block diagram for describing components of a system for testing antenna performance according to an embodiment of the present disclosure.

Referring to FIG. 1, a system 100 for testing antenna performance according to an embodiment of the present disclosure is configured to include a control terminal 120, a signal generator 140, and a tester 160.

The control terminal 120 controls the tester 160 for an antenna performance test. The control terminal 120 may be configured as a terminal such as a smartphone, a tablet personal computer (PC), or a desktop computer performing control. The control terminal 120 is connected to the tester 160 so that data communication is possible, and is connected to the tester 160 via a communication cable such as a serial cable or a universal serial bus (USB) cable as an example. In this case, the control terminal 120 may be connected to a network such as the Internet or an intranet in order to transmit a performance test result to a terminal or a server position outside a test room.

The control terminal 120 outputs a control signal for operating the tester 160 in a calibration mode. That is, when a manager requests entry into the calibration mode via the control terminal 120, the control terminal 120 generates a calibration mode setting signal and outputs the calibration mode setting signal to the tester 160, in response to the manager's request for the entry into the calibration mode.

The control terminal 120 receives and manages a calibration value from the tester 160. The control terminal 120 receives a calibration value set in the tester 160 operating in the calibration mode. The control terminal 120 stores the received calibration value in association with unique information (e.g., a product number, a product name, etc.) of an RF cable 50. In this case, the calibration value is a loss value of the RF cable 50 measured by the tester 160.

The control terminal 120 outputs a control signal for operating the tester 160 in a test mode. That is, when the manager requests entry into the test mode via the control terminal 120, the control terminal 120 generates a test mode setting signal and outputs the test mode setting signal to the tester 160, in response to the manager's request for the entry into the test mode.

The control terminal 120 receives and manages a performance measurement value from the tester 160. That is, the control terminal 120 receives a communication performance measurement value from the tester 160 operating in the test mode. The control terminal 120 stores the communication performance measurement value in association with unique information (e.g., product number, product name, etc.) of the control terminal 120. In this case, the communication performance measurement value is a measurement value received from the tester 160, and is a value obtained by reflecting the calibration value on the communication performance measurement value (i.e., a received signal strength, RSSI) measured by the tester 160.

The signal generator 140 outputs a reference signal in order to calibrate the tester 160 by reflecting the loss of the RF cable 50. The signal generator 140 outputs a preset reference signal for calibration of the tester 160 before a performance test. In this case, the signal generator 140 outputs a UWB signal having a reference signal strength as the reference signal. The reference signal strength is stored in advance in an internal memory of the signal generator 140.

The signal generator 140 is connected to the RF cable 50 and has an output port OP outputting the reference signal to the RF cable 50. The signal generator 140 may be configured to output the reference signal without a separate external power supply by having a rechargeable battery embedded therein.

The tester 160 operates in the calibration mode in response to the calibration mode setting signal from the control terminal 120. The tester 160 sets the calibration value, which is the loss value of the RF cable 50, at the time of operating in the calibration mode.

Figure 2:
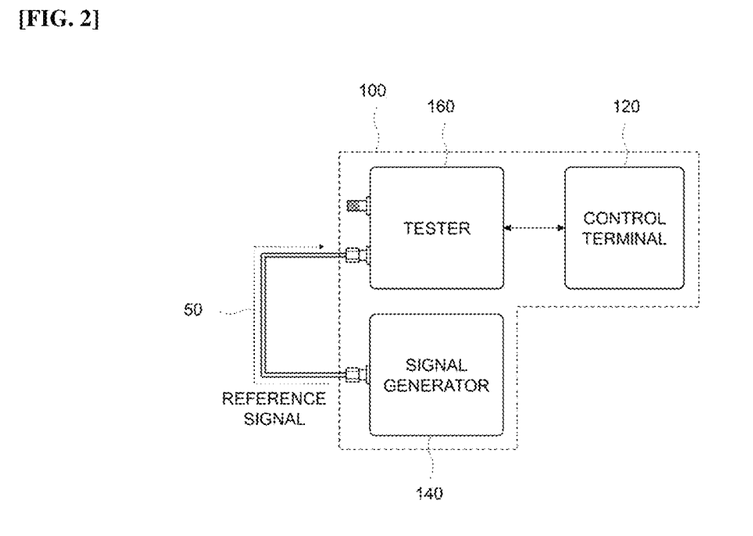
FIG. 2 is a block diagram for describing a calibration mode of the system for testing antenna performance according to an embodiment of the present disclosure.

Referring to FIG. 2, the tester 160 is connected to the signal generator 140 via the RF cable 50 at the time of operating in the calibration mode. Both ends of the RF cable 50 are connected to a calibration port CP of the tester 160 and the output port OP of the signal generator 140, respectively. In this case, the reference signal strength set for calibration of the tester 160 is shared by the signal generator 140 and the tester 160, and is stored in advance in respective internal memories of the signal generator 140 and the tester 160.

The signal generator 140 outputs the reference signal via the output port OP. The signal generator 140 outputs the reference signal having the reference signal strength via the output port OP. The RF cable 50 outputs the reference signal applied via the output port OP of the signal generator 140 to the calibration port CP of the tester 160.

The tester 160 receives the reference signal via the calibration port CP. The tester 160 measures the signal strength (hereinafter, referred to as a received signal strength) of the reference signal received via the calibration port CP.

The tester 160 calculates the loss value of the RF cable 50 by comparing the reference signal strength of the reference signal output to a test port TP with the received signal strength of the reference signal received via the calibration port CP. The tester 160 calculates the loss value of the RF cable 50 by subtracting the received signal strength from the reference signal strength. The tester 160 sets the calculated loss value of the RF cable 50 as the calibration value. The tester 160 may be in a state in which the reference signal strength is stored in an internal memory in order to set the calibration value, and may store the set calibration value in the internal memory.

The tester 160 operates in the test mode for measuring UWB communication performance of a terminal 10 to be tested in response to the test mode setting signal of the control device 120.

Figure 3:
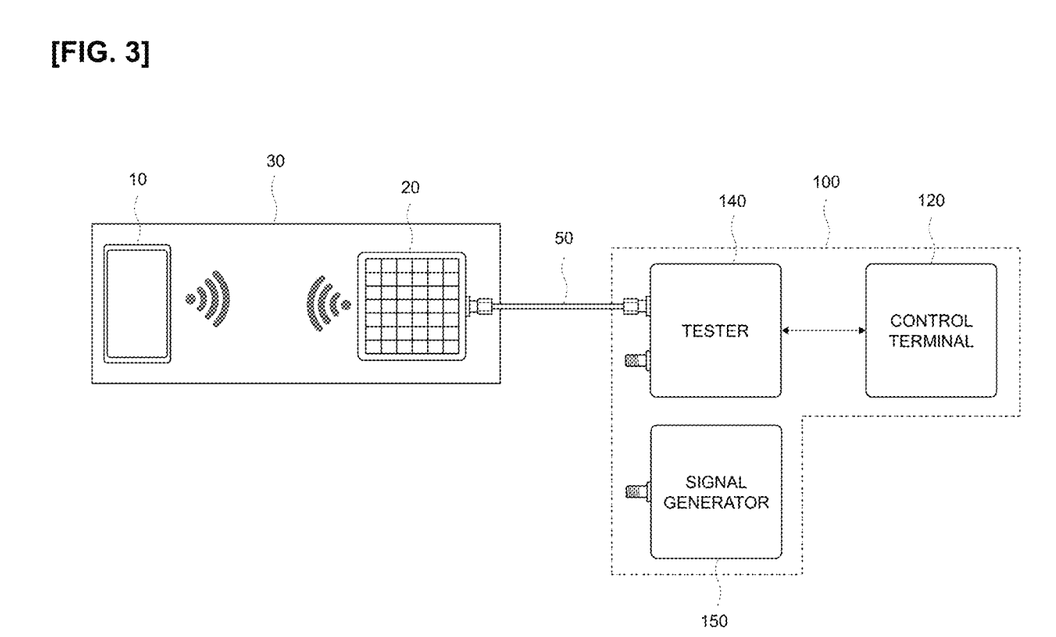
FIG. 3 is a block diagram for describing a test mode of the system for testing antenna performance according to an embodiment of the present disclosure.

Referring to FIG. 3, the terminal 10 to be tested and an UWB antenna 20 are disposed in a shield box 30. Both ends of the RF cable 50 used in the calibration mode are connected to the test port TP of the tester 160 and the UWB antenna 20, respectively.

The tester 160 outputs a test signal via the test port TP. The test signal is output to the UWB antenna 20 via the RF cable 50, and the UWB antenna 20 outputs the test signal.

The terminal 10 to be tested receives the test signal output from the UWB antenna 20, and outputs a response signal corresponding to the test signal but outputs a response signal having a reference signal strength.

The UWB antenna 20 receives the response signal, and the tester 160 measures a signal strength of the response signal received from the UWB antenna 20. The tester 160 calculates a communication performance measurement value by reflecting the calibration value on the measured signal strength (hereinafter, referred to as a measured signal strength). The tester 160 calculates the communication performance measurement value by adding the calibration value to the measured signal strength, and transmits the calculated communication performance measurement value to the control terminal 120.

Figure 4:
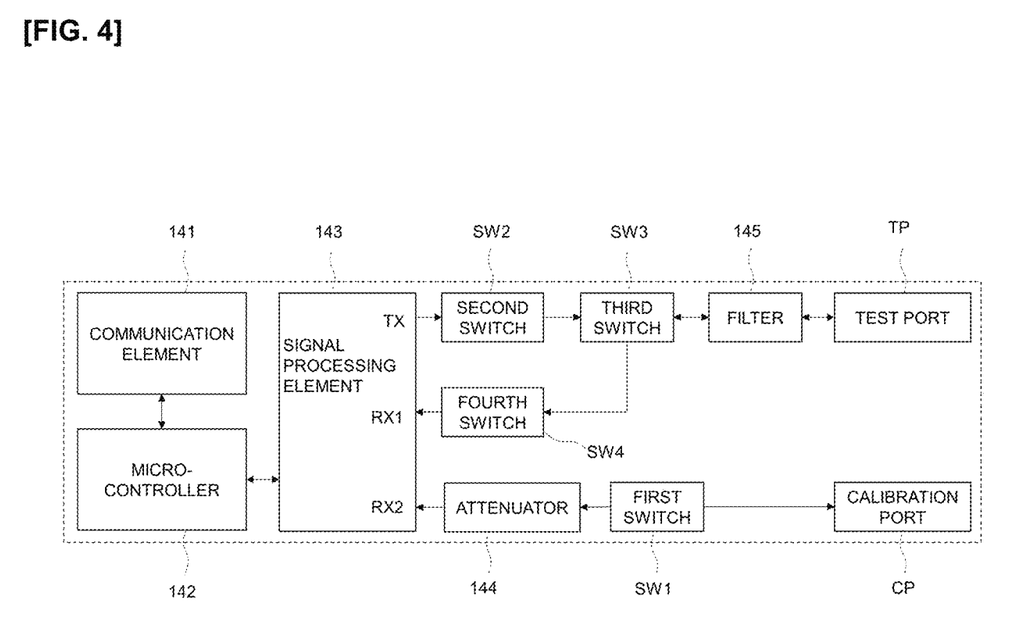
FIG. 4 is a block diagram for describing components of a tester illustrated in FIG. 1.

Referring to FIG. 4, the tester 160 may be configured to include a communication element 141, a microcontroller 142, a signal processing element 143, an attenuator 144, a filter 145, a calibration port CP, a test port TP, a first switch SW1, a second switch SW2, a third switch SW3, and a fourth switch SW4. Here, the first switch SW1 to the fourth switch SW4 are single pole double throw (SPDT) switches having one input (Pole) and two outputs (Throw), as an example.

Figure 5:
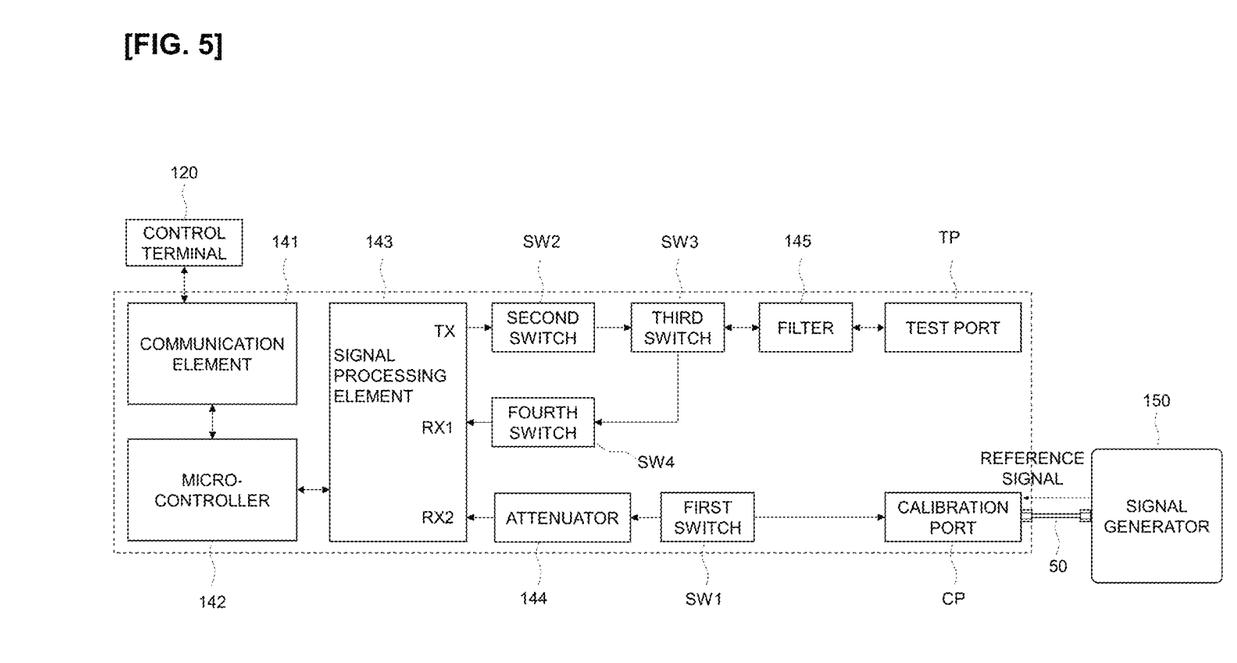
FIG. 5 is a block diagram for describing a calibration mode operation of the tester illustrated in FIG. 1.

Operations of respective components when the tester 160 sets a calibration value will be described below with reference to FIG. 5. In this case, the filter 145, the test port TP, the second switch SW2, the third switch SW3, and the fourth switch SW4 do not perform separate operations at the time of calibration of the tester 160, and will thus be described in a description of communication performance measurement to be provided later.

The tester 160 is connected to the signal generator 140 via the RF cable 50 used at the time of communication performance measurement. Both ends of the RF cable 50 are connected to the calibration port CP of the tester 160 and the output port OP of the signal generator 140, respectively.

The communication element 141 is connected to the control terminal 120 so that data communication is possible. The communication element 141 is connected to the control terminal 120 via a communication cable such as a serial cable or a USB cable.

The communication element 141 receives a calibration mode setting signal from the control terminal 120. The communication element 141 transmits the received calibration mode setting signal to the microcontroller 142. The microcontroller 142 sets the tester 160 to the calibration mode in response to the calibration mode setting signal of the communication element 141.

When the tester 160 is set to the calibration mode, the signal generator 140 outputs a reference signal to the RF cable 50. The signal generator 140 outputs a reference signal, which is a UWB signal having a reference signal strength, to the output port OP. In this case, the signal generator 140 outputs a reference signal having a signal strength corresponding to the reference signal strength stored in the internal memory to the RF cable 50.

The RF cable 50 connected to the output port OP of the signal generator 140 applies the reference signal output from the signal generator 140 to the calibration port CP of the tester 160. The calibration port CP outputs the applied reference signal (hereinafter, referred to as a received signal) to the first switch SW1. The first switch SW1 switches to the attenuator 144 to output the received signal to the attenuator 144. The attenuator 144 attenuates power of the received signal and outputs the received signal of which the power is attenuated to the signal processing element 143.

The signal processing element 143 receives the received signal output from the attenuator 144 via a second receiving terminal RX2 and measures a received signal strength, which is a signal strength of the received signal. The signal processing element 143 outputs the measured received signal strength to the microcontroller 142.

The microcontroller 142 compares the reference signal strength and the received signal strength with to set a calibration value. In this case, the signal processing element 143 calculates a difference between the reference signal strength and the received signal strength as the loss value of the RF cable 50, and sets the calculated loss value as the calibration value. The microcontroller 142 stores the calibration value in an internal memory and outputs the calibration value to the communication element 141.

The communication element 141 transmits the calibration value to the control terminal 120 in response to the output of the calibration value of the microcontroller 142. The control terminal 120 stores and manages the calibration value received from the communication element 141.

Figure 6:
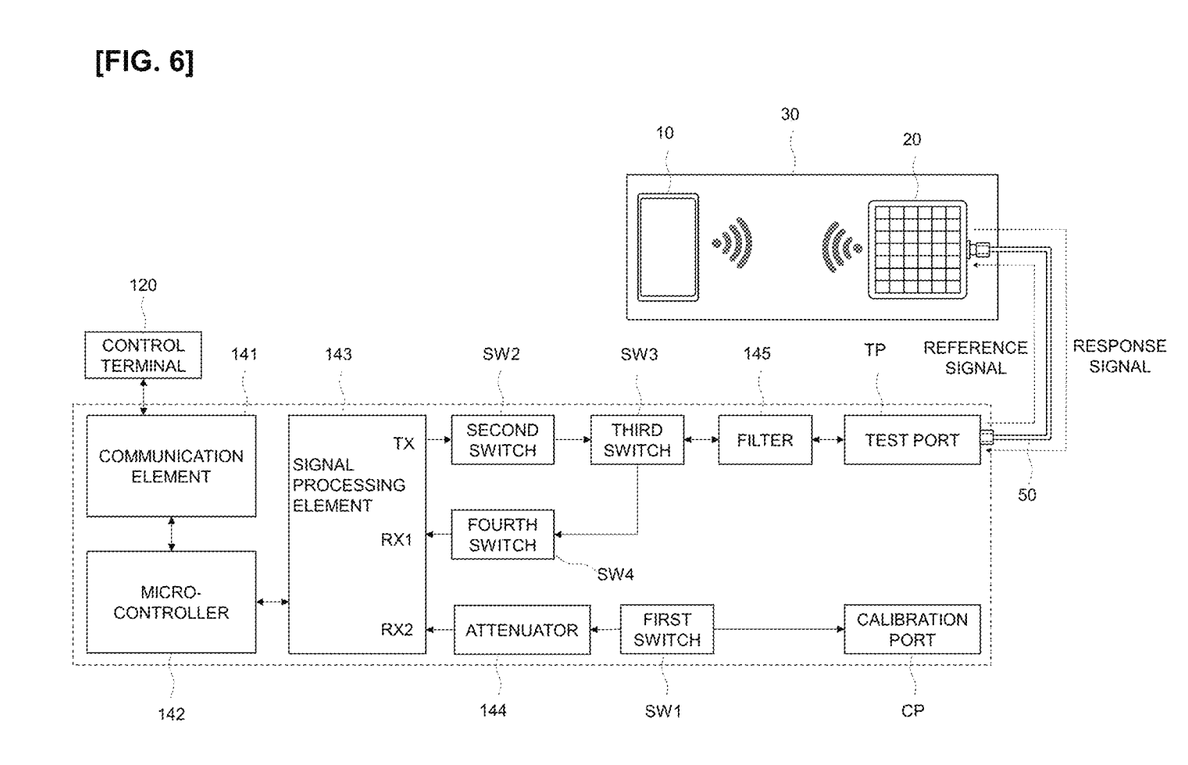
FIG. 6 is a block diagram for describing a test mode operation of the tester illustrated in FIG. 1.

Next, operations of respective components when the tester 160 measures a communication performance measurement value will be described below with reference to FIG. 6. In this case, the calibration port CP, the first switch SW1, and the attenuator 144 do not perform separate operations at the time of communication performance measurement.

The communication element 141 receives a test mode setting signal from the control terminal 120. The communication element 141 transmits the received test mode setting signal to the microcontroller 142.

The microcontroller 142 sets the tester 160 to the test mode in response to the test mode setting signal of the communication element 141. The microcontroller 142 outputs a test signal output request signal to the signal processing element 143 when the tester 160 is set to the test mode.

The signal processing element 143 outputs a test signal to an output terminal TX in response to the test signal output request signal of the microcontroller 142.

The second switch SW2 switches to the third switch SW3 to output the test signal output from the output terminal TX of the signal processing element 143 to the third switch SW3. The third switch SW3 switches to the filter 145 to output the test signal to the filter 145. The test signal passing through the filter 145 is output to the RF cable 50 via the test port TP.

The RF cable 50 applies the test signal to the UWB antenna 20 disposed in the shield box 30. Accordingly, the UWB antenna 20 outputs a UWB signal inside the shield box.

The terminal 10 to be tested receives the test signal output from the UWB antenna 20 and outputs a response signal corresponding to the test signal. In this case, the terminal 10 to be tested outputs a response signal having a reference signal strength.

The UWB antenna 20 receives the response signal of the terminal 10 to be tested, and outputs the received response signal to the RF cable 50. The RF cable 50 applies the response signal to the test port TP, and the test port TP outputs the applied response signal to the filter 145. The filter 145 filters the response signal to remove noise, and then outputs the response signal from which the noise is removed to the third switch SW3.

The third switch SW3 switches to the fourth switch SW4 to output the response signal output from the filter 145 to the fourth switch SW4. The fourth switch SW4 switches to a first receiving terminal TX1 of the signal processing element 143 to output the response signal to the signal processing element 143.

The signal processing element 143 receives the response signal output from the fourth switch SW4 via the first receiving terminal RX1, and measures a received signal strength, which is a signal strength of the received response signal. The signal processing element 143 outputs the measured received signal strength to the microcontroller 142.

The microcontroller 142 calculates a communication performance measurement value by reflecting the correction value by the received signal strength. The microcontroller 142 calculates a value obtained by adding the calibration value to the received signal strength as the communication performance measurement value. The microcontroller 142 outputs the calculated communication performance measurement value to the communication element 141. In this case, the microcontroller 142 may store the communication performance measurement value in the internal memory.

The communication element 141 transmits the communication performance measurement value to the control terminal 120 in response the output of to the communication performance measurement value of the microcontroller 142. The control terminal 120 stores and manages the communication performance measurement value received from the communication element 141.

Meanwhile, as the tester 160 is used in an actual test environment, loss due to internal components of the tester 160 may occur. In the system 100 for testing antenna performance, when the loss due to the internal components of the tester 160 is higher than a reference value, the reliability of a communication performance measurement result is deteriorated. Accordingly, the system 100 for testing antenna performance may additionally have a self-diagnosis function for diagnosing performance deterioration of the tester 160 itself.

Figure 7:
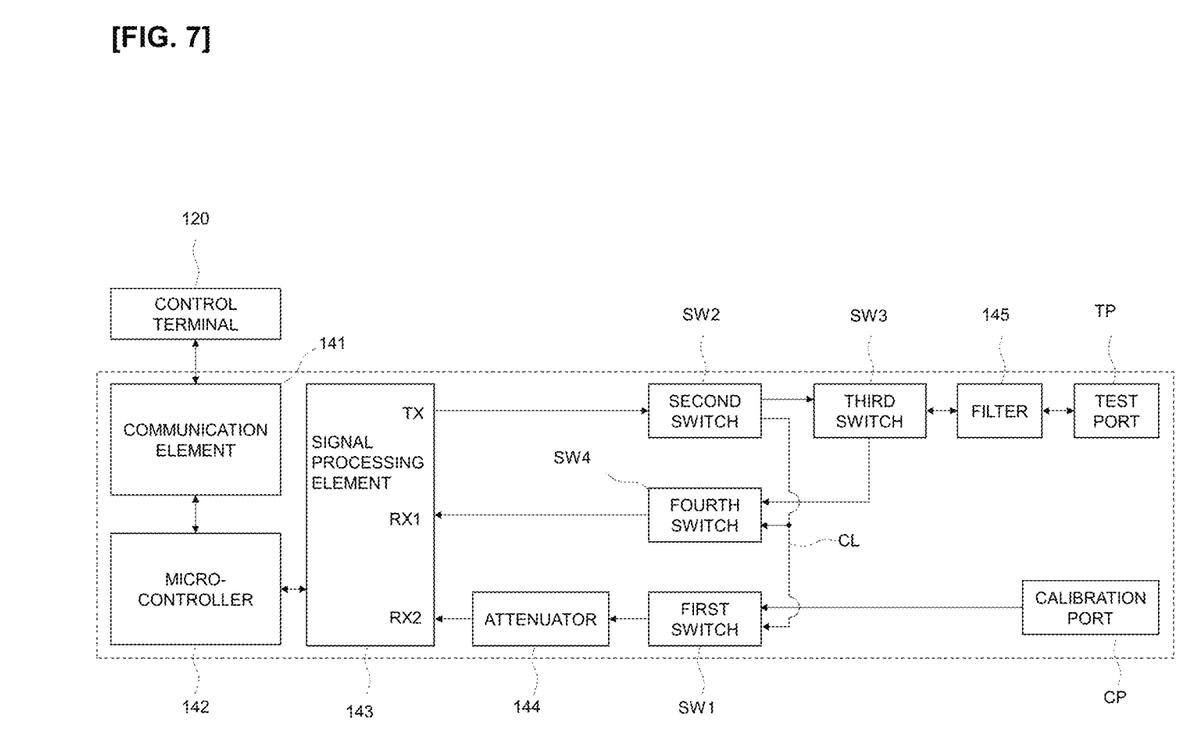
FIGS. 7 to 11 are blocks for describing a self-diagnosis mode operation and components of the tester in FIG. 1.

Referring to FIG. 7, the tester 160 may further include a self-diagnosis circuit line CL for a self-diagnosis mode operation. That is, the self-diagnosis circuit line CL connects an output of the third switch SW3 to an input of the fourth switch SW4 and an input of the first switch SW1.

The control terminal 120 outputs a control signal for operating the tester 160 in a self-diagnosis mode. That is, when the manager requests entry into the self-diagnosis mode via the control terminal 120, the control terminal 120 generates a self-diagnosis mode setting signal and outputs the self-diagnosis mode setting signal to the tester 160, in response to the manager's request for the entry into the self-diagnosis mode.

The tester 160 performs self-diagnosis in response to the self-diagnosis mode setting signal of the control terminal 120, and transmits a self-diagnosis result to the control terminal 120. The control terminal 120 receives and manages the self-diagnosis result from the tester 160, and generates a tester abnormality alarm when there is an abnormality in the self-diagnosis result. In this case, the control terminal 120 may generate the tester abnormality alarm by various methods such as lamp flickering, lighting, output of an alarm screen, and transmission of an alarm to a manager terminal.

Operations of respective components when the tester 160 operates in the self-diagnosis mode will be described below with reference to FIGS. 8 and 9. When the tester 160 operates in the self-diagnosis mode, the test port TP, the calibration port CP, the third switch SW3, and the filter 145 do not perform separate operations, and an illustration and a description thereof will thus be omitted.

The communication element 141 receives a self-diagnosis mode setting signal from the control terminal 120. The communication element 141 transmits the received self-diagnosis mode setting signal to the microcontroller 142.

The microcontroller 142 sets the tester 160 to the self-diagnosis mode in response to the self-diagnosis mode setting signal of the communication element 141. The microcontroller 142 outputs a self-diagnosis start request signal to the signal processing element 143.

The signal processing element 143 starts self-diagnoses on a first signal line CL1 via which the output terminal TX, the second switch SW2, the fourth switch SW4, and the first receiving terminal TX1 are connected to each other and a second signal line CL2 via which the output terminal TX, the second switch SW2, the first switch SW1, and the second receiving terminal TX2 are connected to each other, in response to the self-diagnosis start request signal.

Figure 8:
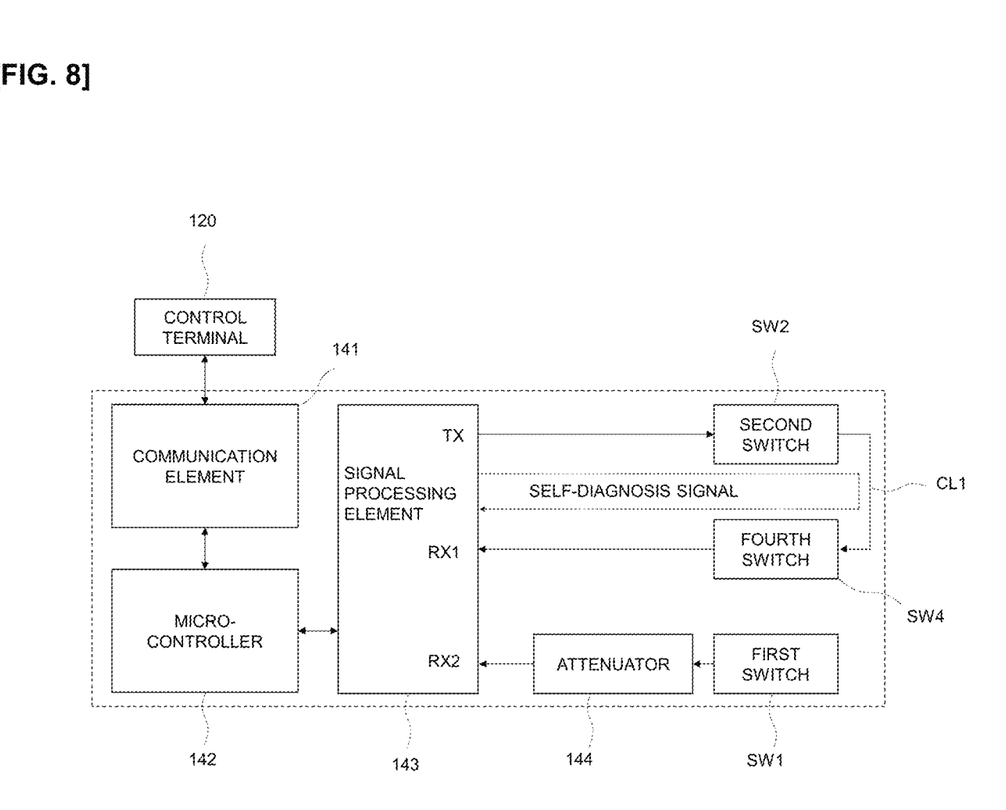

First, referring to FIG. 8, the signal processing element 143 starts the self-diagnosis on the first signal line CL1. The signal processing element 143 transmits a first signal line CL1 connection signal to the second switch SW2, and the second switch SW2 switches the fourth switch SW4 in response to the first signal line CL1 connection signal.

The signal processing element 143 outputs a self-diagnosis signal to the output terminal TX when the switching of the second switch SW2 is completed. Here, the self-diagnosis signal is a UWB signal having a reference signal strength (in other words, a reference signal) as an example.

The second switch SW2 switches the output terminal TX of the signal processing element 143 and the fourth switch SW4 to output a test signal output from the output terminal TX of the signal processing element 143 to the fourth switch SW4. The fourth switch SW4 switches to the signal processing element 143 to output the self-diagnosis signal to the signal processing element 143.

The signal processing element 143 receives the self-diagnosis signal output from the fourth switch SW4 via the first receiving terminal RX1, and measures a received signal strength, which is a signal strength of the received self-diagnosis signal. The signal processing element 143 outputs the measured received signal strength to the microcontroller 142.

The microcontroller 142 compares the received signal strength with the reference signal strength to generate a first self-diagnosis result, which is a self-diagnosis result of the first signal line CL1. The microcontroller 142 generates a difference between the received signal strength and the reference signal strength as the first self-diagnosis result.

Figure 9:
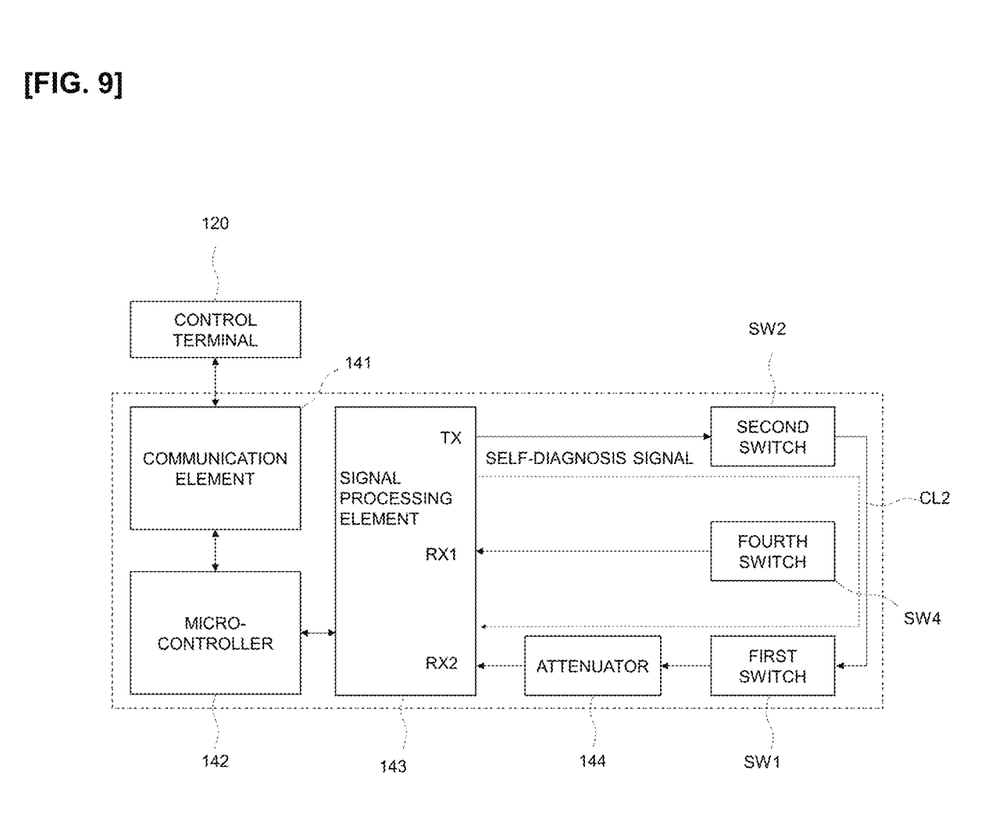

Next, referring to FIG. 9, the signal processing element 143 starts the self-diagnosis on the second signal line CL2 when the self-diagnosis on the first signal line CL1 is completed. The signal processing element 143 transmits a second signal line CL2 connection signal to the second switch SW2, and the second switch SW2 switches the first switch SW1 in response to the second signal line CL2 connection signal.

The signal processing element 143 outputs a self-diagnosis signal to the output terminal TX when the switching of the second switch SW2 is completed.

The second switch SW2 switches the output terminal TX of the signal processing element 143 and the first switch SW1 to output a test signal output from the output terminal TX of the signal processing element 143 to the first switch SW1. The first switch SW1 switches to the signal processing element 143 to output the self-diagnosis signal to the signal processing element 143.

The signal processing element 143 receives the self-diagnosis signal output from the first switch SW1 via the second receiving terminal RX2, and measures a received signal strength, which is a signal strength of the received self-diagnosis signal. The signal processing element 143 outputs the measured received signal strength to the microcontroller 142.

The microcontroller 142 compares the received signal strength with the reference signal strength to generate a second self-diagnosis result, which is a self-diagnosis result of the second signal line CL2. The microcontroller 142 generates a difference between the received signal strength and the reference signal strength as the second self-diagnosis result.

The microcontroller 142 outputs a self-diagnosis result to the communication element 141 when the self-diagnosis on the second signal line CL2 is completed. In this case, the microcontroller 142 may output a self-diagnosis result including the first self-diagnosis result and the second self-diagnosis result to the communication element 141, and may store the self-diagnosis result in the internal memory.

The communication element 141 transmits the self-diagnosis result to the control terminal 120 in response to the output of the self-diagnosis result of the microcontroller 142. The control terminal 120 stores and manages the self-diagnosis result received from the communication element 141.

A self-diagnosis reference value with the set error range is set and stored in the control terminal 120, and the control terminal 120 comparing the self-diagnosis result with the self-diagnosis reference value and generates a tester abnormality alarm. In this case, a self-diagnosis reference value corresponding to the first self-diagnosis result and a self-diagnosis reference value corresponding to the second signal line CL2 may be set to have different values or different error ranges.

The control terminal 120 determines that the tester 160 is abnormal and generates the tester abnormality alarm, when at least one of the first self-diagnosis result and the second self-diagnosis result is out of the error range of the self-diagnosis reference value.

Figure 10:
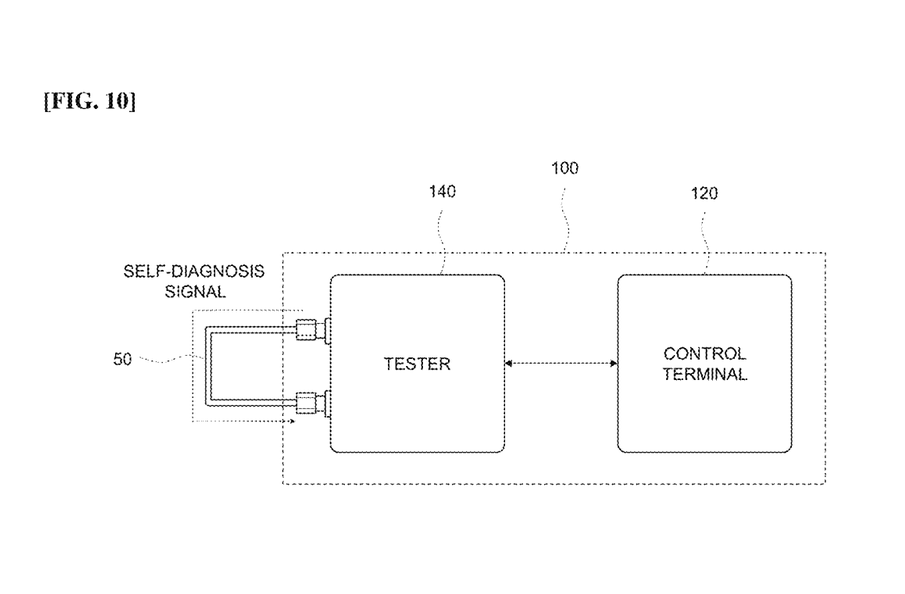
Figure 11:
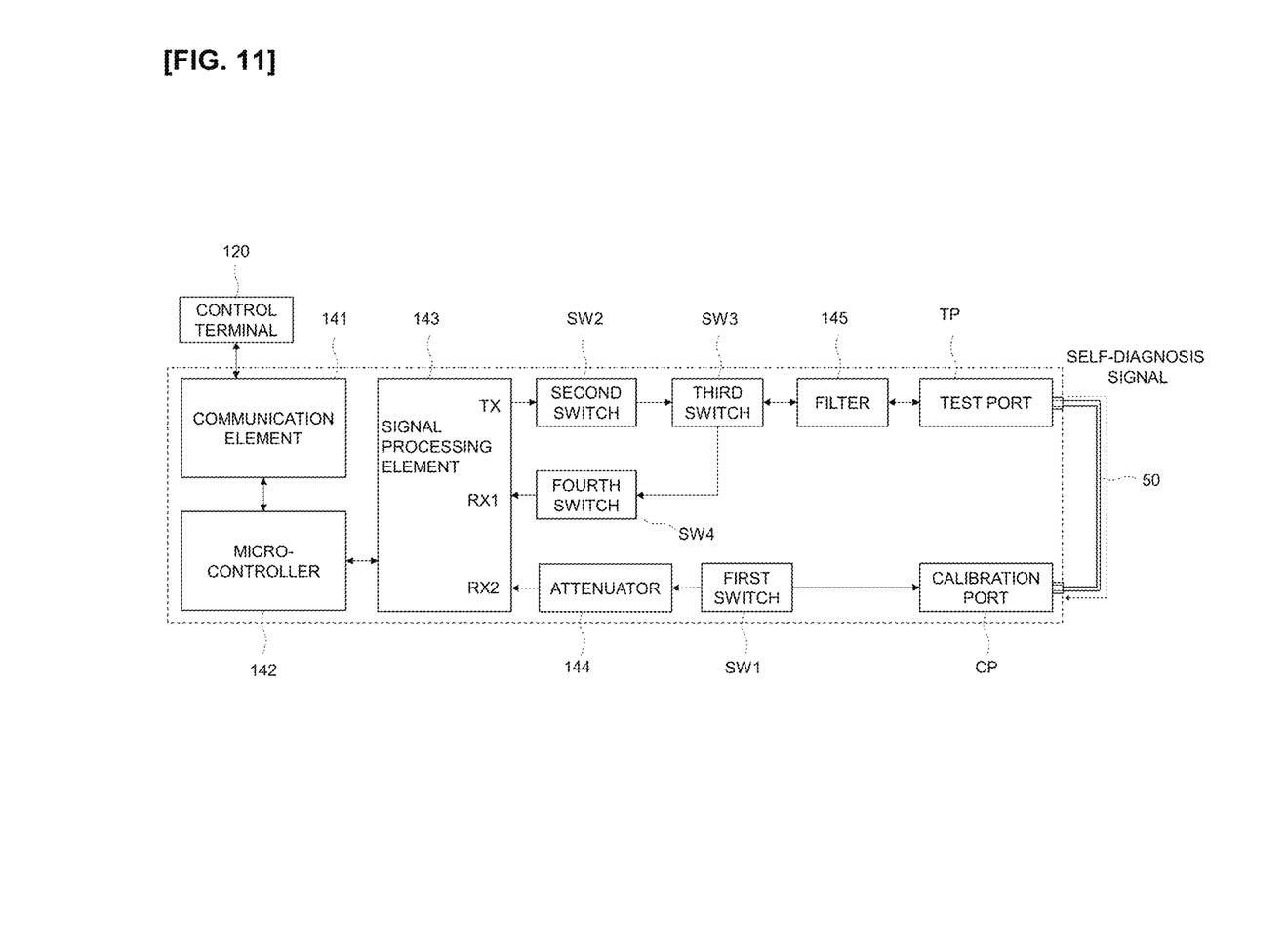

Meanwhile, referring to FIGS. 10 and 11, the tester 160 may also perform a self-diagnosis in a state in which the test port TP and the calibration port CP are connected to each other via the RF cable 50.

The communication element 141 receives a self-diagnosis mode setting signal from the control terminal 120. The communication element 141 transmits the received self-diagnosis mode setting signal to the microcontroller 142.

The microcontroller 142 sets the tester 160 to the self-diagnosis mode in response to the self-diagnosis mode setting signal of the communication element 141. The microcontroller 142 outputs a self-diagnosis start request signal to the signal processing element 143.

The signal processing element 143 constitutes a signal line via which the output terminal TX, the second switch SW2, the third switch SW3, the filter 145, the test port TP, the RF cable 50, the calibration port CP, the first switch SW1, the attenuator 144, and the second receiving terminal RX2 are connected to each other, and start a self-diagnosis on the signal line, in response to the self-diagnosis start request signal.

The signal processing element 143 outputs a self-diagnosis signal to the output terminal TX when the constitution of the signal line is completed. Here, the self-diagnosis signal is a UWB signal having a reference signal strength (in other words, a reference signal) as an example.

The second switch SW2 switches the output terminal TX of the signal processing element 143 and the third switch SW3 to output a test signal output from the output terminal TX of the signal processing element 143 to the third switch SW3. The third switch SW3 switches to the filter 145 to output the self-diagnosis signal to the filter 145. The test signal passing through the filter 145 is output to the RF cable 50 via the test port TP.

The RF cable 50 outputs the self-diagnosis signal output from the test port TP to the calibration port CP. The calibration port CP outputs the self-diagnosis signal to the first switch SW1. The first switch SW1 switches to the attenuator 144 to output the self-diagnosis signal to the attenuator 144. The attenuator 144 attenuates an amplitude of the self-diagnosis signal within a set range, and then outputs the self-diagnosis signal of which the amplitude is attenuated to the signal processing element 143.

The signal processing element 143 receives the self-diagnosis signal output from the attenuator 144 via the second receiving terminal RX2, and measures a received signal strength, which is a signal strength of the received self-diagnosis signal. The signal processing element 143 outputs the measured received signal strength to the microcontroller 142.

The microcontroller 142 compares the received signal strength with the reference signal strength to generate a self-diagnosis result. The microcontroller 142 generates a difference between the received signal strength and the reference signal strength as the self-diagnosis result. The microcontroller 142 outputs the self-diagnosis result to the communication element 141.

The communication element 141 transmits the self-diagnosis result to the control terminal 120 in response to the output of the self-diagnosis result of the microcontroller 142. The control terminal 120 stores and manages the self-diagnosis result received from the communication element 141.

A self-diagnosis reference value with the set error range is set and stored in the control terminal 120, and the control terminal 120 compares the self-diagnosis result with the self-diagnosis reference value to generate a tester abnormality alarm. In this case, the control terminal determines that the tester 160 is abnormal and generates a tester abnormality alarm, when the self-diagnosis result is out of the error range of the self-diagnosis reference value, the control terminal 120.

Here, it has been described in a description related to FIGS. 8 to 11 that the control terminal 120 generates the tester abnormality alarm based on the self-diagnosis reference value and the self-diagnosis result, but the present disclosure is not limited thereto, and the microcontroller 142 may also generate the tester abnormality alarm based on the self-diagnosis reference value and the self-diagnosis result.

Although the preferred embodiments of the present disclosure have been described hereinabove, various modifications may be made, and it is understood that those skilled in the art may implement various modifications and alterations without departing from the scope of the claims of the present disclosure.

The invention claimed is:

1. A system for testing antenna performance, comprising:
a tester including a test port, the test port being connected, via a cable, to an antenna that communicates with a terminal to be tested, in a shield box, when a test mode is set; and
a signal generator including an output port and outputting a reference signal having a reference signal strength to the output port,
wherein the tester outputs a test signal to the test port, receives a response signal corresponding to the test signal via the test port, and calculates a value obtained by adding a calibration value to a received signal strength of the response signal as a communication performance measurement value, and
wherein the tester further includes a calibration port connected to the output port via the cable when a calibration mode is set, and sets the calibration value based on the reference signal strength and a received signal strength of the reference signal input to the calibration port when the calibration mode is set.

2. The system for testing antenna performance of claim 1, wherein the tester calculates a difference value between the reference signal strength and the received signal strength as a loss value of the cable and sets the loss value as the calibration value.

3. The system for testing antenna performance of claim 1, wherein the tester further includes a test port connected to a calibration port via the cable in a self-diagnosis mode, and
the tester generates a value obtained by subtracting, from a signal strength of a self-diagnosis signal output via the test port, a received signal strength of the self-diagnosis signal received via the calibration port, as a self-diagnosis result.

4. The system for testing antenna performance of claim 1, wherein the tester includes:
a signal processing element measuring a received signal strength of a reference signal input via a receiving terminal when a calibration mode is set; and
a microcontroller connected to the signal processing element, calculating a difference between the received signal strength measured by the signal processing element and a reference signal strength as a loss value of the cable, and setting the loss value as the calibration value.

5. The system for testing antenna performance of claim 4, wherein the signal processing element outputs a test signal to an output terminal when the test mode is set, receives a response signal corresponding to the test signal via a receiving terminal different from the receiving terminal, and measures a received signal strength of the response signal, and
the microcontroller sets a value obtained by adding the calibration value to the received signal strength measured by the signal processing element as a communication performance measurement value.

6. The system for testing antenna performance of claim 5, wherein the tester further includes:
a test port connected, via the cable, to the antenna that communicates with the terminal to be tested, in the shield box, when the test mode is set, outputting the test signal from the output terminal of the signal processing element to the antenna, and receives the response signal corresponding to the test signal from the antenna; and
a switch switching to the different receiving terminal to connect the test port and the different receiving terminal to each other and outputting the response signal input to the test port to the different receiving terminal.

7. The system for testing antenna performance of claim 1, wherein the tester includes:
a signal processing element including an output terminal and a receiving terminal, outputting a self-diagnosis signal having a reference signal strength to the output terminal when a self-diagnosis mode is set, and measuring a received signal strength of a received signal received through the receiving terminal; and
a microcontroller generating a tester abnormality alarm based on the received signal strength.

8. The system for testing antenna performance of claim 7, wherein the microcontroller determines that the tester is abnormal and generates the tester abnormality alarm, when the received signal strength is out of an error range of a self-diagnosis reference value.

9. The system for testing antenna performance of claim 7, wherein the receiving terminal includes a first receiving terminal and a second receiving terminal, and the tester further includes a switch switching the output terminal to one of the first receiving terminal and the second receiving terminal.

* * * * *